US006892103B1

(12) United States Patent
Allred et al.

(10) Patent No.: US 6,892,103 B1
(45) Date of Patent: *May 10, 2005

(54) DIGITAL TONE CONTROL WITH LINEAR STEP COEFFICIENTS

(75) Inventors: Rustin W. Allred, Plano, TX (US); Robert S. Young, Jr., Austin, TX (US); Michael J. Tsecouras, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/408,095

(22) Filed: Sep. 27, 1999

Related U.S. Application Data

(60) Provisional application No. 60/102,410, filed on Sep. 30, 1998.

(51) Int. Cl.[7] .................................................. H03G 5/00
(52) U.S. Cl. ........................................ 700/94; 381/101
(58) Field of Search ................................ 708/300, 322, 708/323; 387/98, 103; 700/94

(56) References Cited

U.S. PATENT DOCUMENTS 5,572,443 A * 11/1996 Emoto et al. ................ 702/103
5,687,104 A * 11/1997 Lane et al. .................. 708/300
6,661,900 B1 * 12/2003 Allred et al. ................ 381/103

OTHER PUBLICATIONS

Yinong Ding, et al., "Filtering Morphing of Parametric Equalizers and Shelving Filters for Audio Signal Processing", *J. Audio Eng. Soc.*, vol. 43, No. 10, 1995 Oct., pp. 821–826.

J.N. Mourjopoulos, et al., "Theory and Real–Time Implementation of Time–Varying Digital Audio Filters", *J. Audio Eng. Soc.*, vol. 38, No. 7/8, 1990 Jul./Aug., pp. 522–537.

Udo Zoelzer, et al., "Strategies for Switching Digital Audio Filters", Presented at the 95th Convention of the Audio Engineering Society on Oct. 7–10, 1993, New York.

* cited by examiner

*Primary Examiner*—Minsun Oh Harvey
*Assistant Examiner*—Brian Pendleton
(74) *Attorney, Agent, or Firm*—Lawrence J. Bassuk; W. James Brady; Frederick J. Telecky, Jr.

(57) ABSTRACT

Digital audio tone control implemented using Shelving filters for the digital audio treble tone control exhibits artifacts (noise, distortion, etc.) as the tone control settings are changed. This was previously accomplished by changing filter coefficients in the traditional small equal (on a dB scale) filter steps of a fraction of 1 dB. While this worked for bass filters, artifacts were still present for treble. This invention eliminates these artifacts by changing the filter steps to small equal steps on a linear scale. Additionally, where the steps became too large for the resolution required, additional filter steps are added. Approximately 150 filter steps are used for treble control and 128 filter steps are used for bass tone control. An efficient way of implementing the filter steps for digital tone control stores (119) one set of filter coefficient values and a small amount of additional information and then increments the coefficients between all the other steps. This reduces the memory required by as much as 95% or the machine cycles for implementing filter coefficients by 40–200 times. This new efficient method is accomplished by: 1) defining the filter coefficients, 2) piecewise linearizing the plot of filter coefficients versus filter step to define the linear regions, 3) defining the initial set of filter coefficients, and 4) defining increments between the filter steps.

18 Claims, 10 Drawing Sheets

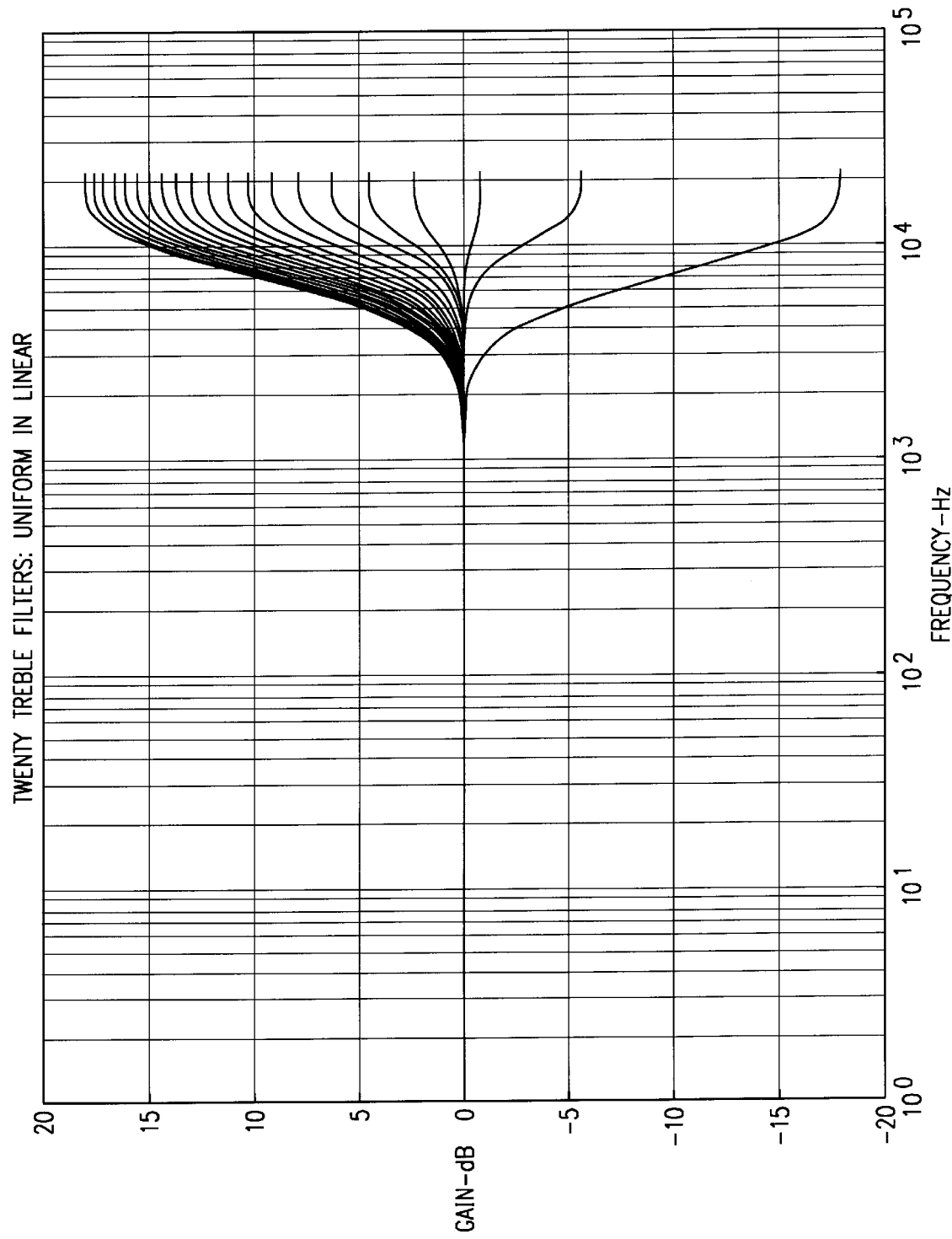

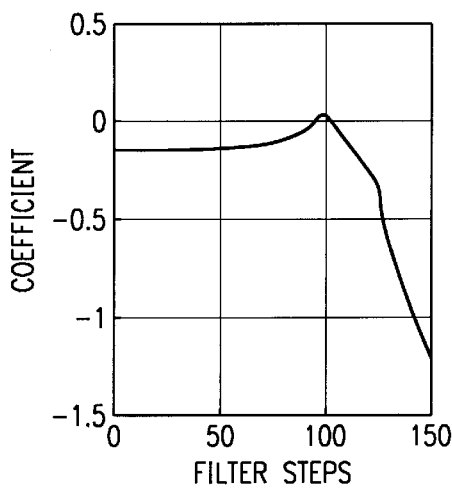
FIG. 11-a1
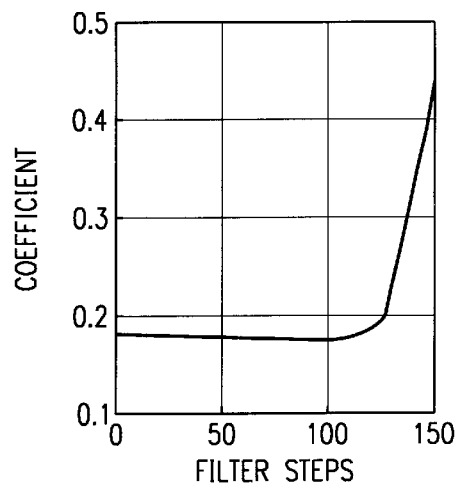
FIG. 11-a2
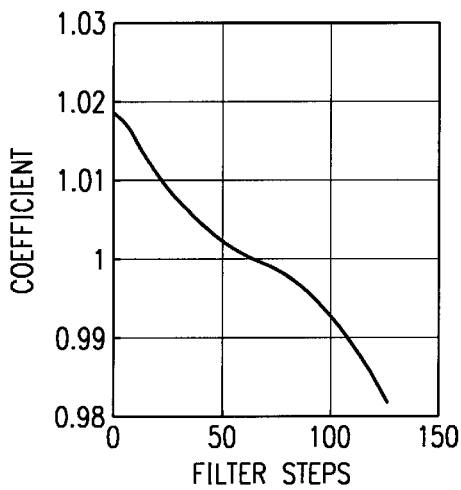
FIG. 11-b0
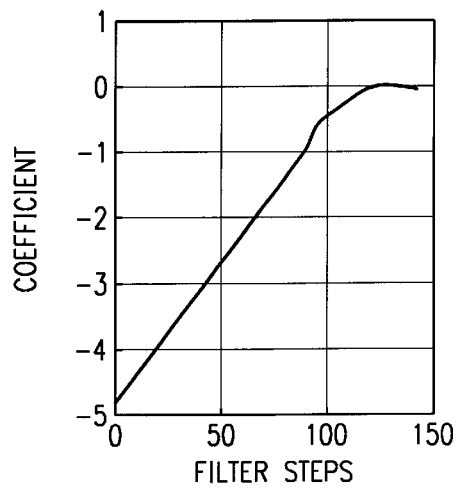
FIG. 11-b1
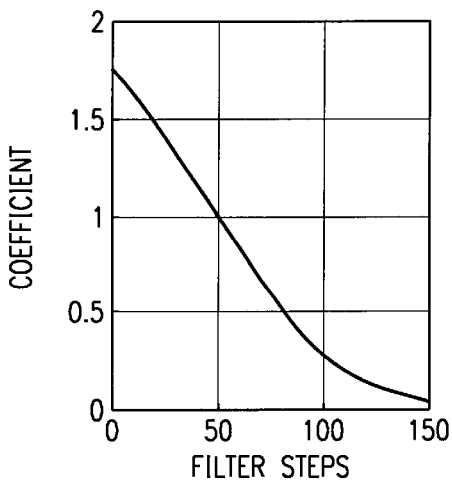
FIG. 11-b2
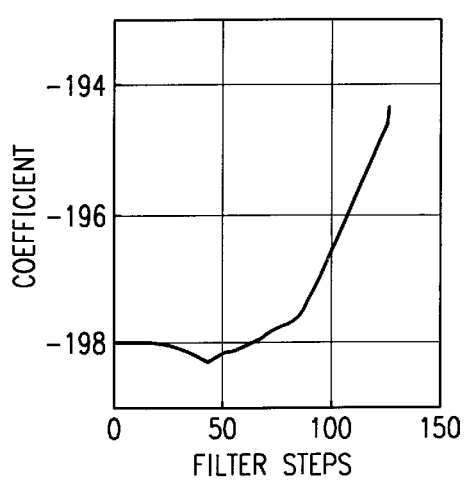
FIG. 12-a1

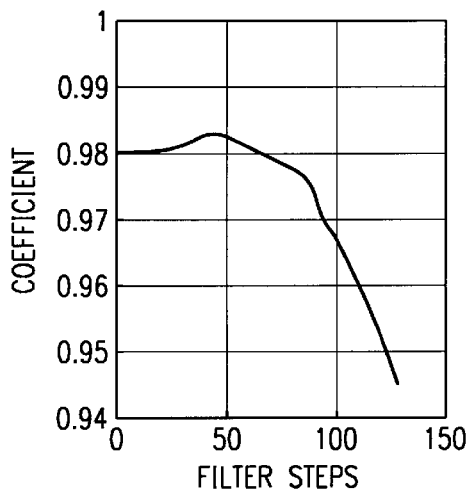
FIG. 12-a2
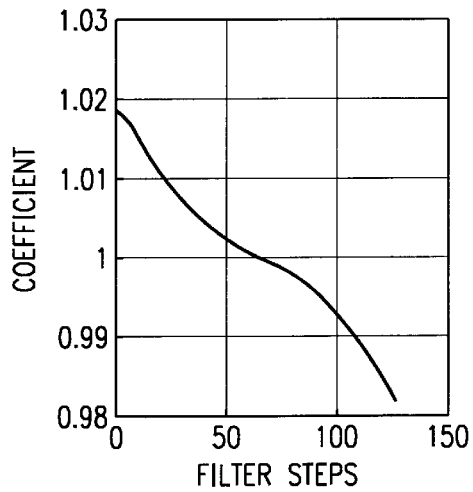
FIG. 12-b0
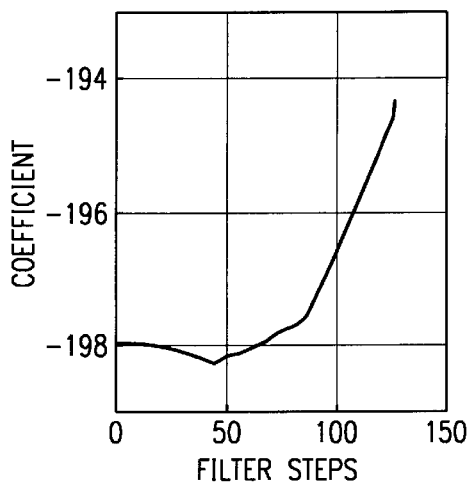
FIG. 12-b1
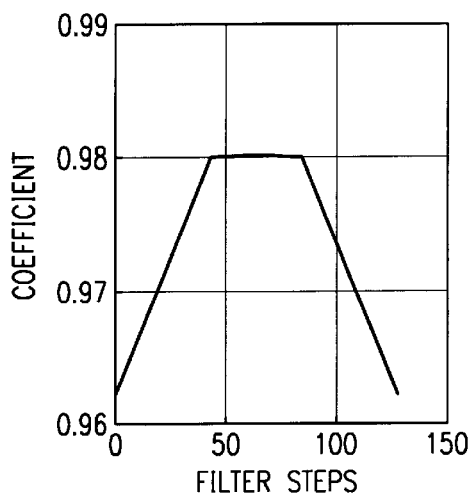
FIG. 12-b2
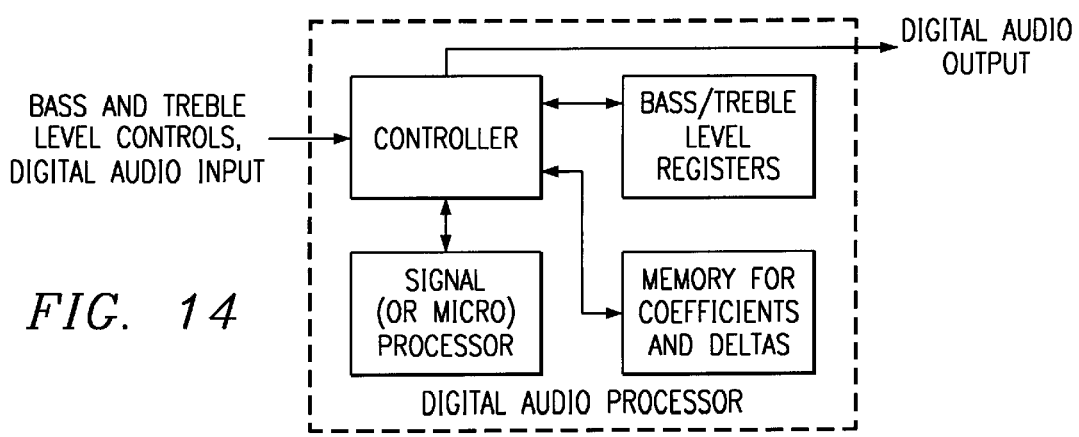
FIG. 14

DIGITAL TONE CONTROL WITH LINEAR STEP COEFFICIENTS

RELATED APPLICATIONS

This application claims the benefit of U.S. Provisional Application No. 60/102,410, entitled Digital Tone Control With Linear Step Coefficients, filed on Sep. 30, 1998 by Rustin W. Allred, et al.

TECHNICAL FIELD OF THE INVENTION

This invention relates to an improved method of implementing digital audio tone controls that produces a higher performance audio output signal without artifacts (noise or distortion) when changing tone control settings. This is accomplished by using a unique, highly efficient method of changing digital filter coefficients. This invention applies to all applications that eliminate artifacts produced by real-time adjustability of digital filters.

DESCRIPTION OF THE RELATED ART

Processing of audio signals to improve their listening characteristics has long been a well-understood and common area of technology. Sources of these audio signals are many and varied: radio and TV stations, tapes, CD's, PC's, and satellites to name only a few. Audio signals are an important part of everyone's life. To that end, clear, noise and distortion free listening is the goal of most audio systems. Adjustability of the broadband gain (volume), high-frequency gain (treble) and low-frequency gain (bass) are desirable if not necessary features for most audio systems.

Historically, systems have received analog audio signals. Even today most systems, are designed to receive and process analog audio signals without conversion. FIG. 1 shows a block diagram of a typical audio system showing the source (100), the audio processing (101) and the loudspeaker (102) which translate the audio signal into sound that the human can hear. FIG. 2 shows how a typical analog audio system is implemented. It shows, the source (103), an equalizer (104) which may be used to flatten the system spectral response, a tone control (105) which adjusts the gain in the particular (bass or treble) frequency range, an audio amplifier (106) which adjusts the overall signal strength and loudspeaker.

Several comments concerning the equalizer and tone control are appropriate. As indicated, the equalizer flattens the system spectral response in the audio signal band. Usually, an ideal response is flat from approximately 20 Hz to 20 kHz. The tone control (bass and/or treble) is essential in most systems and can be used with or without the equalizer. Current high performance systems generally use an analog equalizer. As indicated, the tone control increases or decreases the audio signal gain in a particular frequency range. In the case of treble, the range is the high end of the audio band and is approximately 10 kHz and above. In the case of bass, the frequency range is the low end of the audio band and is approximately 20 Hz to a few hundred Hz. FIG. 3 shows a typical audio spectrum with the impact of the tone control bass boost and cut of +/−18 dB. The impact is primarily below 100 Hz. The middle plot is the original signal. FIG. 4 shows a typical audio spectrum (averaged for clarity) with the impact of the tone control treble boost and cut of +/−18 dB. As in FIG. 3 the middle plot is the original signal. The upper and lower plots are the original signal with either boost (increased gain) or cut (reduced gain) respectively.

The advantages of the analog systems are: 1) the natural world is analog and even today many signals are produced in analog format, 2) well-implemented analog systems produce excellent sound, with little or no perceived distortion, particularly for high performance systems and 3) there is a large inventory of history and experience among analog designers. However, the analog systems do have some limitations. The world is rapidly converting to digital systems because of the high cost of analog compared to digital systems, and the improved flexibility and programmability as well as their ease of storing and transmitting data. In analog systems, the systems performance tends to be limited by the characteristics of the available components, and systems tend to be hard-wired. This is not the case with digital systems.

The advantages of digital audio systems are well known but will be summarized for clarity. First, and foremost, digital systems offer performance advantages not available in analog systems. These advantages arise from the ability of digital systems; 1) to implement most any mathematical function, 2) immunity to noise and 3) programmability. In general, digital systems will also be less expensive, often significantly, than their similarly performing analog counterparts.

Because of the many advantages of digital systems, analog audio systems are beginning a rapid conversion either totally or in part to digital technology. Digital inputs from such audio systems as Compact Disks (CD's), introduced in the early 1980's by Sony, combined with inputs from such standard digital audio interfaces as AES/EBU-SPDIF and IEEE 1394 are forcing system designers to consider total digital audio systems, including equalizers and tone control. For the most part, audio amplifiers and loudspeakers are likely to remain analog for the foreseeable future. Digital audio signals are converted to analog after processing using well known Digital-to-Analog Converters (DAC) technology, prior to amplification and input to the speaker. In fact, today the output of many commercial products/systems are now digital rather than analog, such as DVD, Digital Tape, Direct Satellite broadcasting, High Definition TV (HDTV) broadcasting and many others. Most entertainment content including audio is now produced and processed digitally by the content providers.

The block diagram of a conceptual "known art" hybrid digital audio system is shown in FIG. 5. A digital system is implemented as shown in the top portion of FIG. 5. It contains a digital sound source (107), a digital equalizer (108), which is optional, a digital tone control (111) and a DAC (112) to convert the processed digital audio signal back to analog for input into the audio amplifier (113) and speaker. Since much content (input signals) is still in analog form, systems may be designed to accept either analog or digital signals. The lower portion of FIG. 5 shows the Analog-to-Digital conversion (ADC) function (110) added to the system to produce a hybrid analog/digital system, able to receive and process digital or analog signals. Although such a hybrid system is not yet typical in the marketplace, it is considered known art since the literature implies it. This invention makes such a system more feasible.

This invention relates to the tone control section of the digital audio system described in FIG. 5. Known art for implementation of the digital tone control for a single channel is shown in FIG. 6. The typical audio system would include a separate digital filter for treble (114) and bass (115) in each channel, controlled by some form of integrated circuit controller (116). FIG. 5 shows only one channel, however the second or multiple channels would each be identical and controlled by the same processor (116). The input processor (116) can be a microprocessor ($\mu$P), microcontroller ($\mu$C), Digital Signal Processor (DSP) or custom controller, whichever may be available in the system or is the most cost effective. DSPs are particularly well suited and very efficient for the type of mathematics required to control and store the information to implement and change digital filters. The tone control input to the controller can be produced by either a mechanical or electrical stimulus. Mechanical inputs from potentiometers, keyboards and shaft encoders converted to electrical inputs are common.

The filters used in the digital tone control are typically Shelving filters. In this application, Shelving filters converge toward 0 dB in the center of the audio band, and toward some finite value at the band edge. Although many filters have parameters that remain fixed during use, the parameters of audio tone control filters must be adjustable.

The operation and mathematics of digital filters are widely discussed in the following reference: 1) Proakis & Manolakis, "Introduction to Digital Signal Processing", MacMillan Publishing Co., 1998.

Digital filters for audio processing are discussed in detail in the following references: 1) Yinong Ding & David Rossum, "Filter Morphing of Parametric and Shelving Filter for Audio Signal Processing", Pages 821–826, Journal of Audio Engineering Society, Volume 43, No. 10, October 1995. 2) Mourjopoulos, Kyriakis-Bitzaros and Goutis, "Theory and Real-Time Implementation of Time-Varying Digital Audio Filters", Pages 523–536, Journal of the Audio Engineering Society; Audio/Acoustics/Applications, Volume 38, Number 7/8, July/August 1990. 3) Zoelzer, Redmer and Bucholtz, "Strategies for Switching Digital Audio Filters", Audio Engineering Society (AES) Reprint, Number 3714 (B1-PM-6), presented at AES Convention in New York on Oct. 7–10, 1993.

A typical digital filter architecture can be defined as shown in FIG. 7. Where $a_0$, $a_1$, $a_2$ & $b_0$, $b_1$, $b_2$ are the filter coefficients and $z^{-n}$ is a delay of n samples. The transfer function of the filter can be described as:

$$Hz = \frac{Y(z)}{X(z)} = \frac{b_0 + b_1 * z^{-1} + b_2 * z^{-2}}{a_0 + a_1 * z^{-1} + a_2 * z^{-2}} \quad (1)$$

Where: Y(z) is the audio output signal (frequency domain) and X(z) is the input signal (frequency domain) In the references, the operation of digital filters is discussed in detail and is well known to those in the trade. According to the referenced literature, filter coefficients should generally be changed in such a way that the filter response sequences through a number of small (fraction of a dB), exponentially equal filter steps when traversing between the current and desired gain settings.

When testing this concept of digital tone control, on a digital audio system using the CD digital audio output, 16 bit signal and a sample rate of 44.1 kHz, it was found that undesirable artifacts were introduced. These artifacts take the form of noise or distortion, such as clicks, pops and zipper noise (a series of pops) as the bass and treble levels were adjusted. It was thought that smaller filter steps (down to a fraction of a dB) might solve the problem, but artifacts were still present when the smaller steps were used. This was particularly true with treble control. The large number of smaller steps, in itself introduces additional problems for the designer. These are: 1) implementation time; more steps require more settings for a +/−18 dB audio control range. 2) increase in programming complexity and 3) additional potential cost of increased memory size requiring a larger semiconductor die.

SUMMARY OF THE INVENTION

This invention provides a new and very unique way of designing a digital audio tone control system that will eliminate artifacts as the settings are changed. Also described is a very efficient method of implementing the complex digital Shelving filter coefficients used in both the treble and bass tone controls. This will be applicable where there are limitations, such as 1) memory storage space, 2) processor computational power, 3) integrated circuit die size available and/or 4) other cost considerations. Typically, this efficient method could be very important for small, cost sensitive, moderate-high performance stand-alone audio systems, while the method of eliminating artifacts is applicable to any digital tone control implementation.

Digital audio tone control may be implemented using Shelving filters. It was found that the digital audio treble tone control exhibited artifacts (noise, distortion, etc.) as the tone control settings were changed. This was previously accomplished by changing filter coefficients in the traditional small equal (on a dB scale) filter steps of a fraction of 1 dB. While this worked for bass filters, artifacts were still present for treble. This invention found that these artifacts could be eliminated by changing the filter steps to small equal steps on a linear scale. Additionally, where the steps became too large for the resolution required, additional filter steps were added. 150 filter steps were used for treble control and 128 filter steps were used for bass tone control.

A very efficient way of implementing the filter steps for digital tone control is described. Instead of storing all of the filter coefficients, or the equations for the calculation of filter coefficients and then calculating each coefficient step, this invention stores one set of filter coefficient values and a small amount of additional information and then increments the coefficients between all the other steps. This invention can reduce the memory required by as much as 95% or the machine cycles for implementing filter coefficients by 40–200 times. This new efficient method is accomplished by: 1) defining the filter coefficients, 2) piecewise linearizing the plot of filter coefficients versus filter step to define the linear regions, 3) defining the initial set of filter coefficients, and 4) defining increments between filter steps.

BRIEF DESCRIPTION OF DRAWINGS

FIGS. 8A and 8B are graphs of the "Treble Filter Gain Versus Frequency" using both a linear dB scale and a linear scale for 20 output steps between +/−18 dB;

FIGS. 11A, 11B, 11C, 11D and 11E are graphs of the "Filter Coefficients Versus the Filter Step" for each of the filter transfer function variables ($a_1$, $a_2$, $b_0$, $b_1$, $b_2$) for the digital audio treble tone control concept used;

FIGS. 12A, 12B, 12C, 12D and 12E are graphs of the "Filter Coefficients Versus the Filter Step" for each of the filter transfer function variables ($a_1$, $a_2$, $b_0$, $b_1$, $b_2$) for the digital audio bass tone control concept used;

FIG. 14 is a functional block diagram of the hardware implementation of the digital treble and bass tone control described in this invention.

DETAILED DESCRIPTION OF THE INVENTION

The present invention is a new and very unique way of designing a digital audio tone control system that will eliminate artifacts as the treble tone controls are changed. Also described will be a very efficient method of implementing the complex Shelving filters used in both the treble and bass tone controls. This will be applicable where there are limitations, such as 1) memory storage space, 2) processor computational power, 3) available die size for memory and/or 4) cost considerations.

Characteristics of Pleasant Sounding Bass and Treble Controls

The initial consideration leading to this invention was removal of the artifacts that can occur when the bass and treble controls are adjusted by changing the digital filter coefficients. Experiments were performed where the filter coefficients were changed with varying granularity. The time lapse between coefficient changes was also varied. Subjective listening tests indicated that the bass adjustment is much less susceptible to audible artifacts than the treble adjustment. It was discovered that audible artifacts would occur in the treble adjustment even if the granularity of the change was a small fraction of a dB. A method to eliminate the treble artifacts is a claim of the invention. It was found that changing the Shelving filter coefficients such that the gain of the treble filter changes linearly, as opposed to logarithmically as in the traditional dB scale, would eliminate artifacts.

Figure 1:
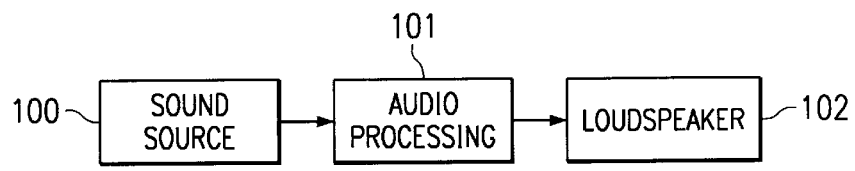
FIG. 1 is a block diagram of a "Typical Audio System", including the sound source, audio processing section, and the loudspeaker.
Figure 2:
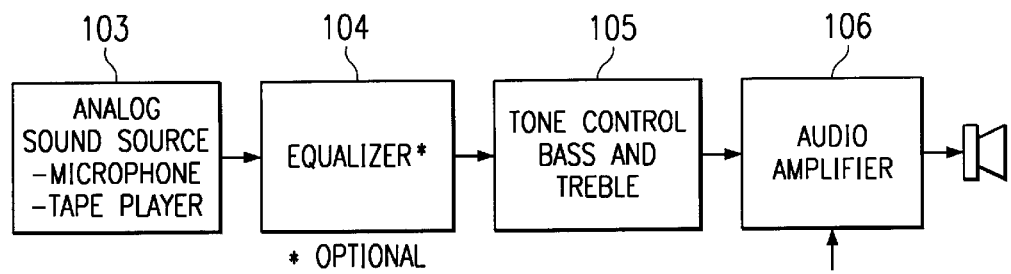
FIG. 2 is a block diagram of a "Typical Analog Audio System", including the sound source, equalizer, tone control for base and treble, audio amplifier and speaker.
Figure 3:
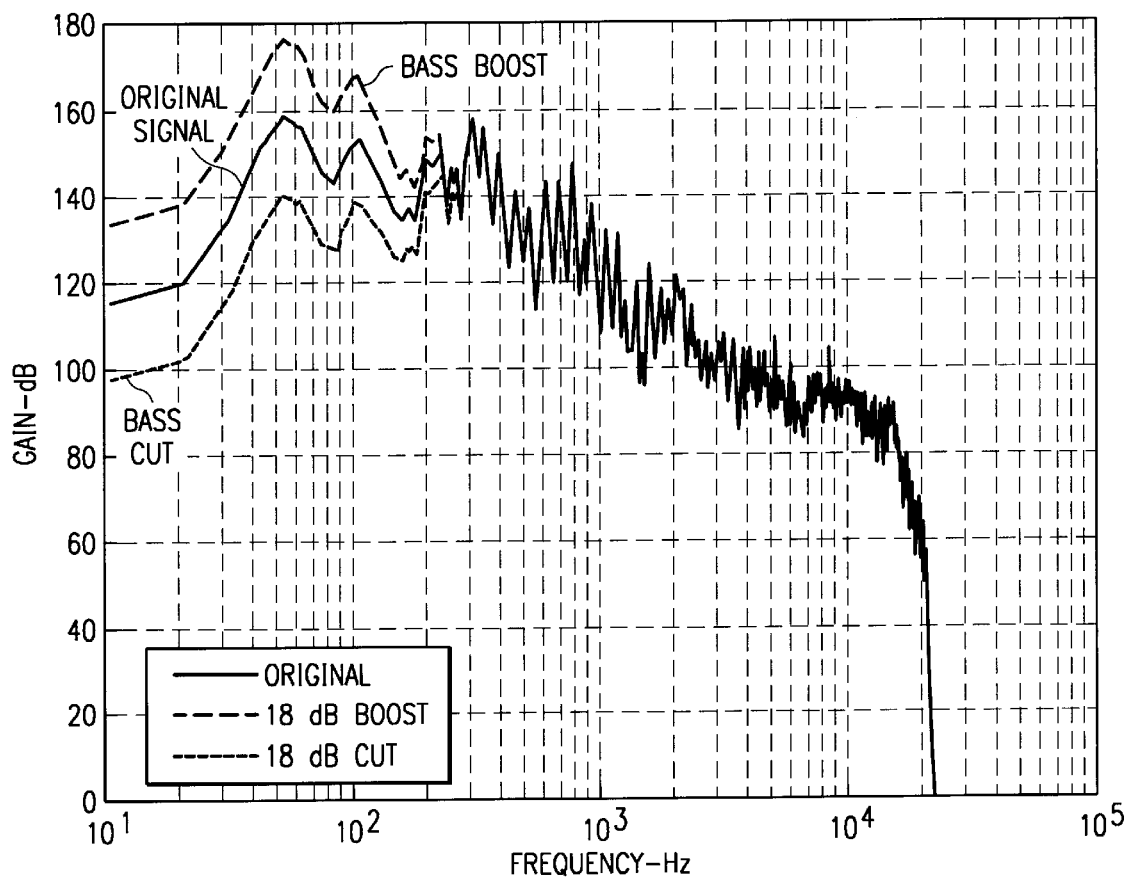
FIG. 3 is a graph of "Typical (unnormalized) Audio Spectrum" and the resultant signal after tone control bass cut or boost over +/−18 dB range.
Figure 4:
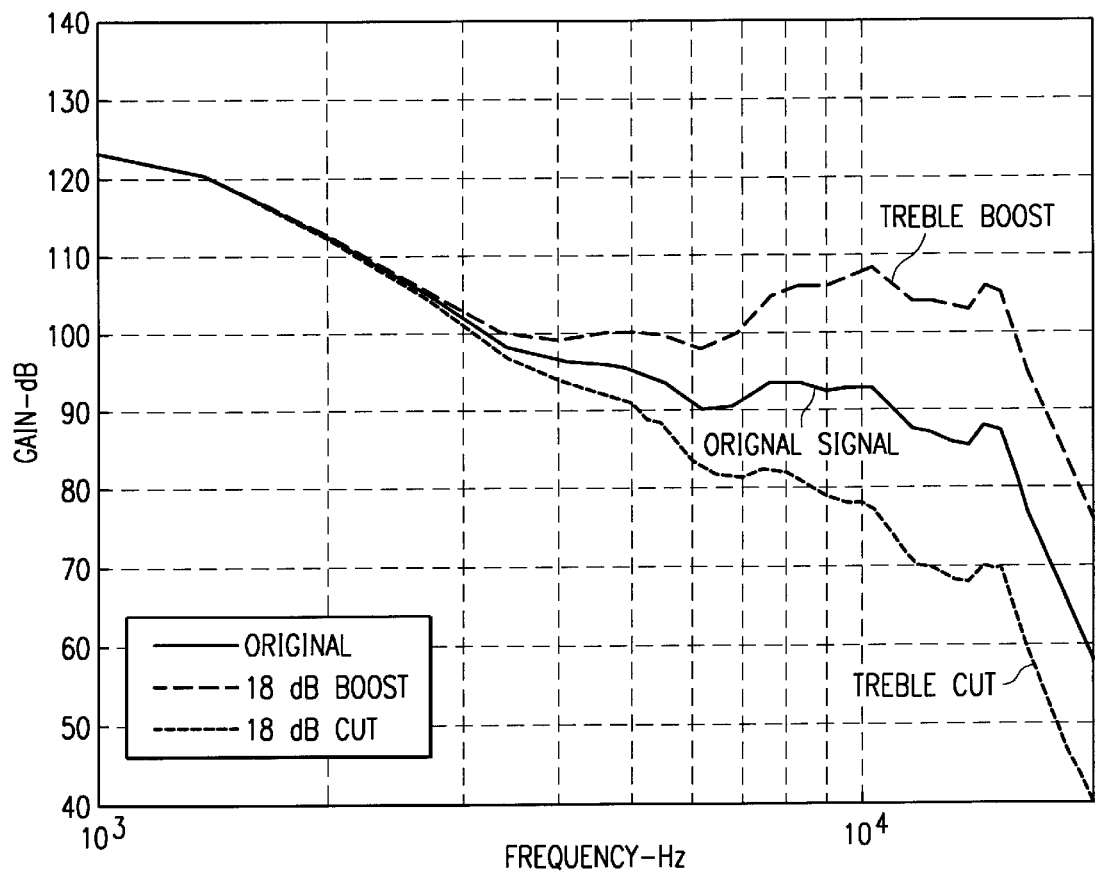
FIG. 4 is a graph of "Typical (unnormalized) Audio Spectrum" (averaged for clarity) and the resultant signal after tone control treble cut or boost over +/−18 dB range.
Figure 5:
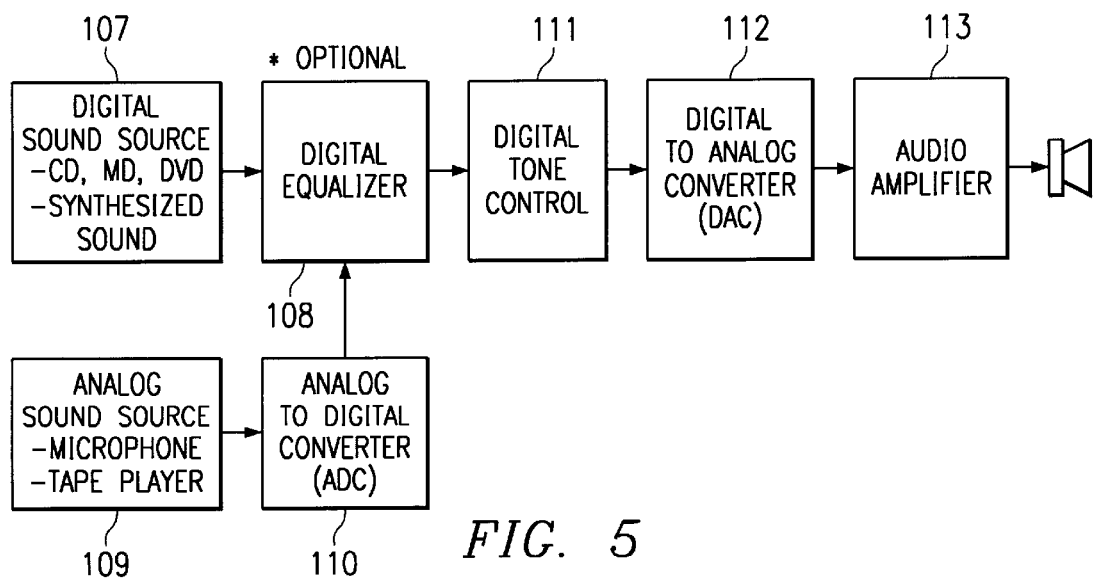
FIG. 5 is a block diagram of a "Conceptual Hybrid (Digital and Analog) Audio System"
Figure 6:
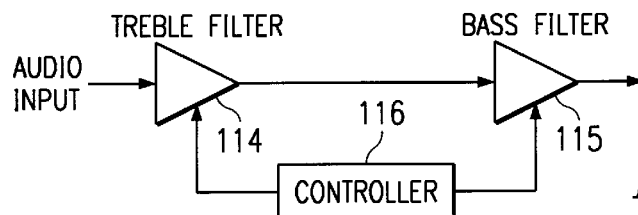
FIG. 6 is a block diagram of a one channel for a "Typical Digital Tone Control System"
Figure 7:
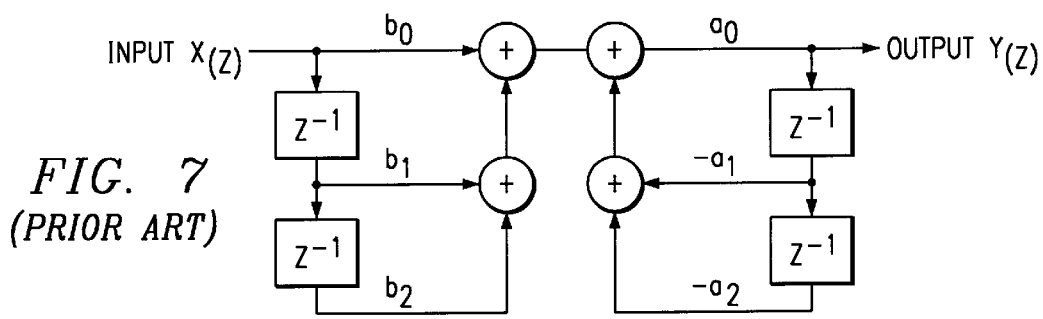
FIG. 7 is a diagram of a "Typical Digital Filter Architecture"
Figure 7A:
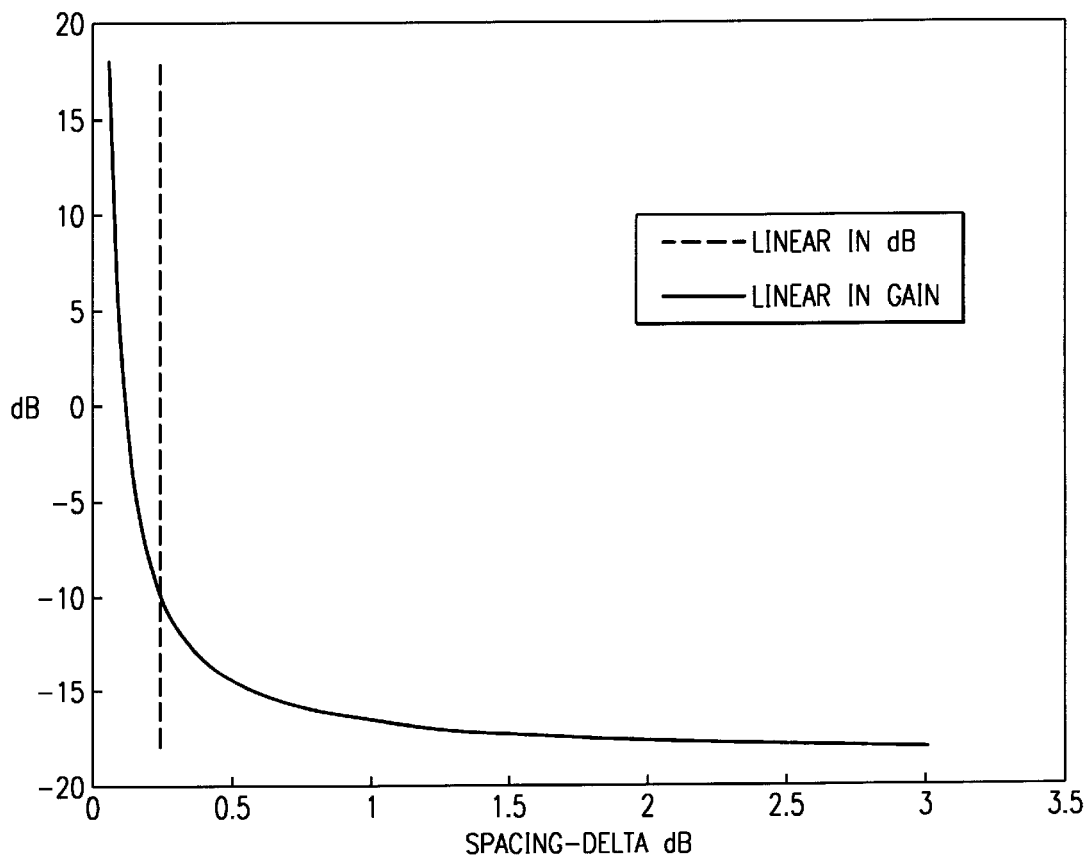
FIG. 7A is a graph of a "Plot of Filter Gain in dB Versus Delta dB of the Filter Steps for both Equal Linear Steps and Equal dB Steps"

The concept of changing the filter steps in equal increments on a linear basis versus the standard equal increments on a dB basis needs further explanation. The plot in FIG. 7A shows a plot of the filter gain in dB versus the delta dB of the filter steps for equal linear steps and the known art and more traditional equal dB steps. As expected when plotting equal dB steps, a straight line at the defined dB step delta is obtained. In the plot (dotted line) the dB spacing is 0.25 dB equally spaced between all filter steps. Plotting equal linear spacing between filter steps shows a much different outcome. As the gain traverses from +18 dB to −10 dB, the filter steps increase gradually on a dB scale, but as traversal continues between −10 dB and −18 dB the filter steps become large. This is significant because steps greater than 1 dB are a problem for the designer, as will be discussed later.

Figure 8A:
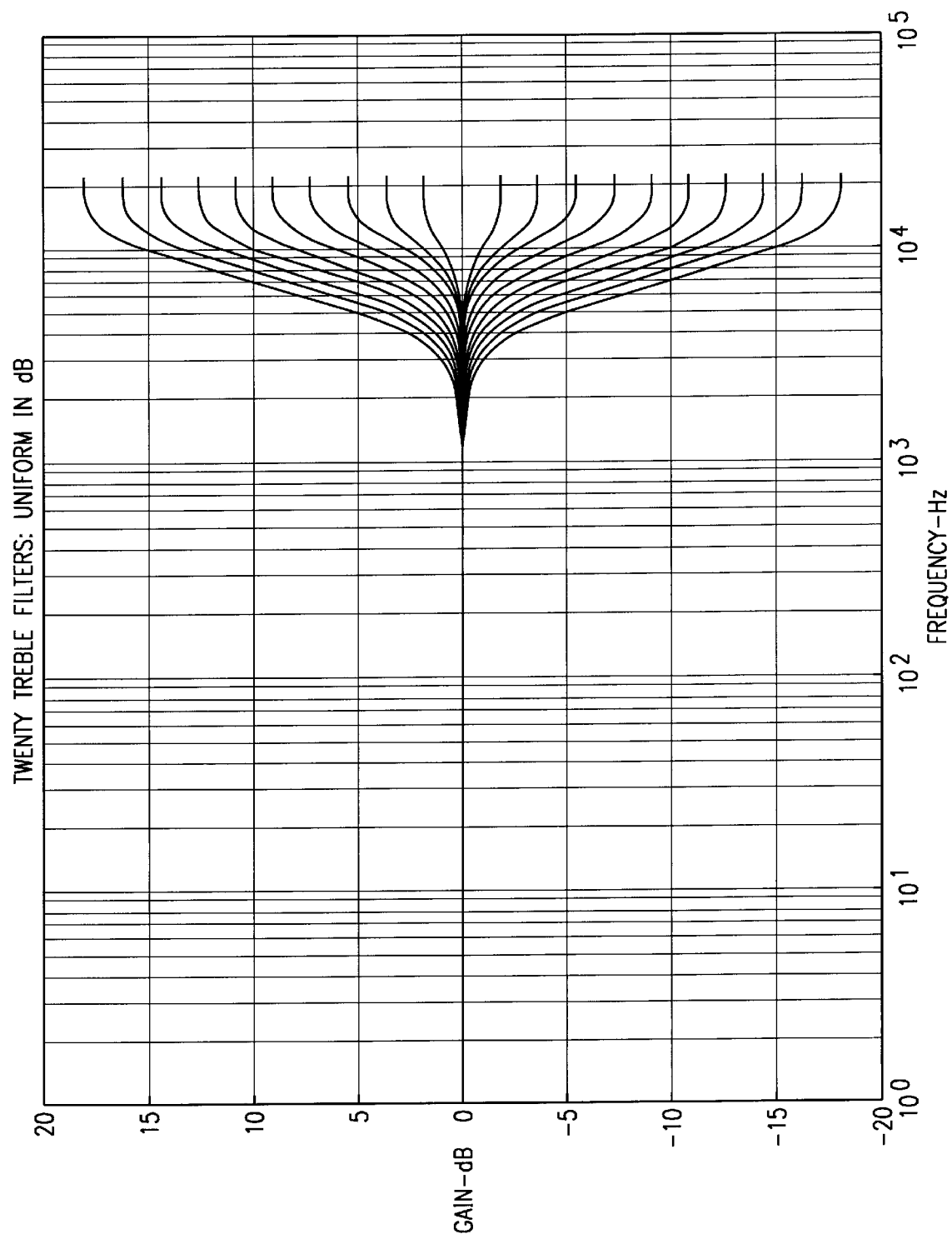

FIG. 8 shows the conceptual difference between the frequency responses of digital filters that might be used in a digital treble tone control as the filter traverses uniformly on a traditional dB scale (left chart) or standard linear scale (right chart) in 20 steps over a +/−18 dB range. The plot on the left (FIG. 8A) is the treble digital filter frequency response Hz for twenty digital Shelving filters with uniform (equal) dB steps. The plot in FIG. 8B is the treble filter frequency response for twenty digital shelving filters with uniform linear steps between +/−18 dB.

While changing the gain in uniform linear increments helps to eliminate artifacts, it is still necessary to change the gain in small increments. Further, the listening experience is greatly enhanced by leaving some amount of delay between coefficient changes. It was determined that 128 filters with uniform gain distribution and with approximately 64 samples (at 44.1 kHz) between treble gain changes was the best sounding configuration. This configuration sounds much like analog controls. This need not be exactly 128 filters or 64 samples. This general approach will eliminate artifacts. The values 128, and 64, as well as other various coefficients described below, represent one working embodiment of this concept. When the treble adjustment is made, a move is made through each of the filters between the old gain level and the new, with a delay of 64 samples between each change.

Figure 9:
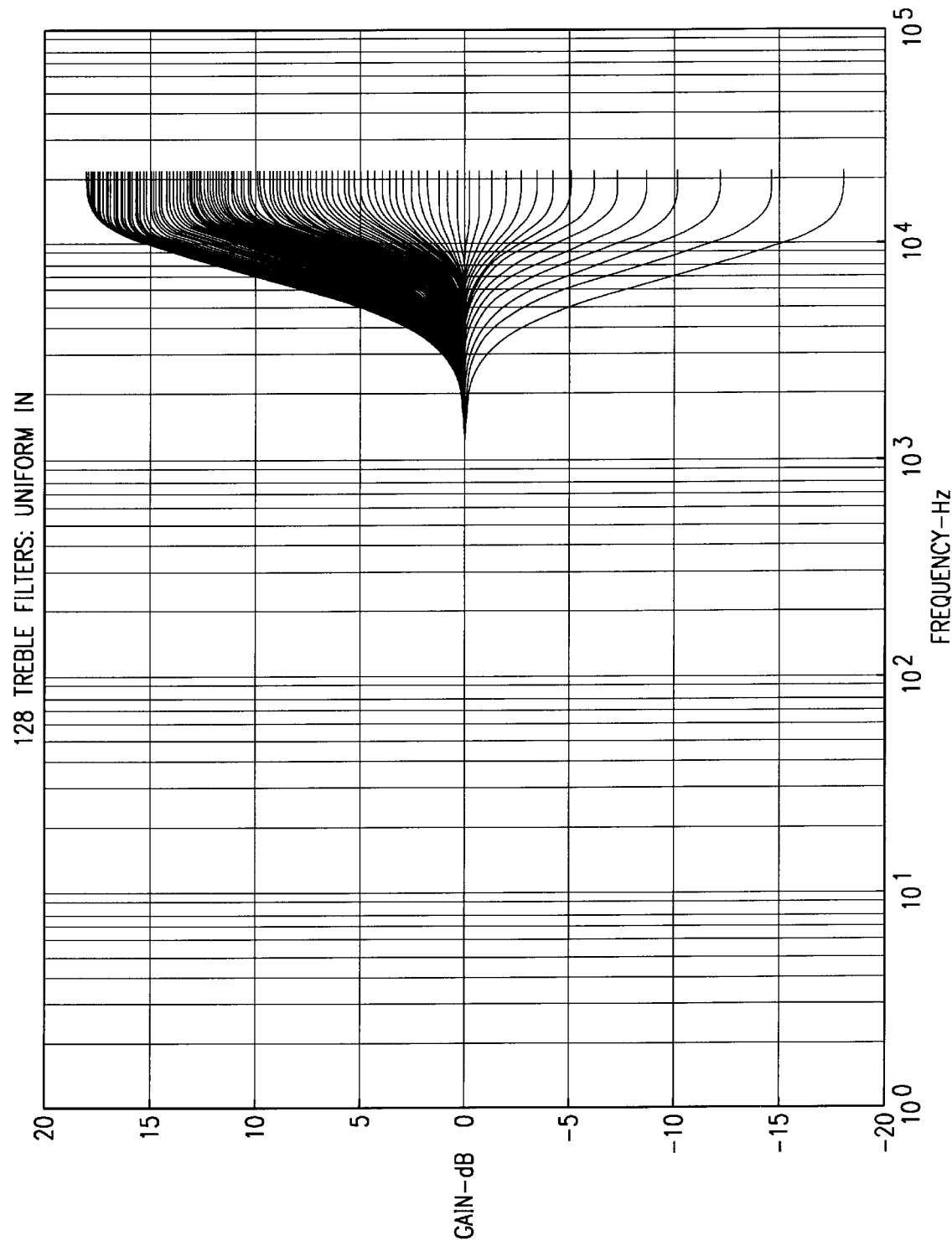
FIG. 9 is a graph of a "Treble Audio Tone Control Filter Gain Versus Frequency" for 128 digital Shelving filters with equal linear filter steps between +/−18 dB.
Figure 10:
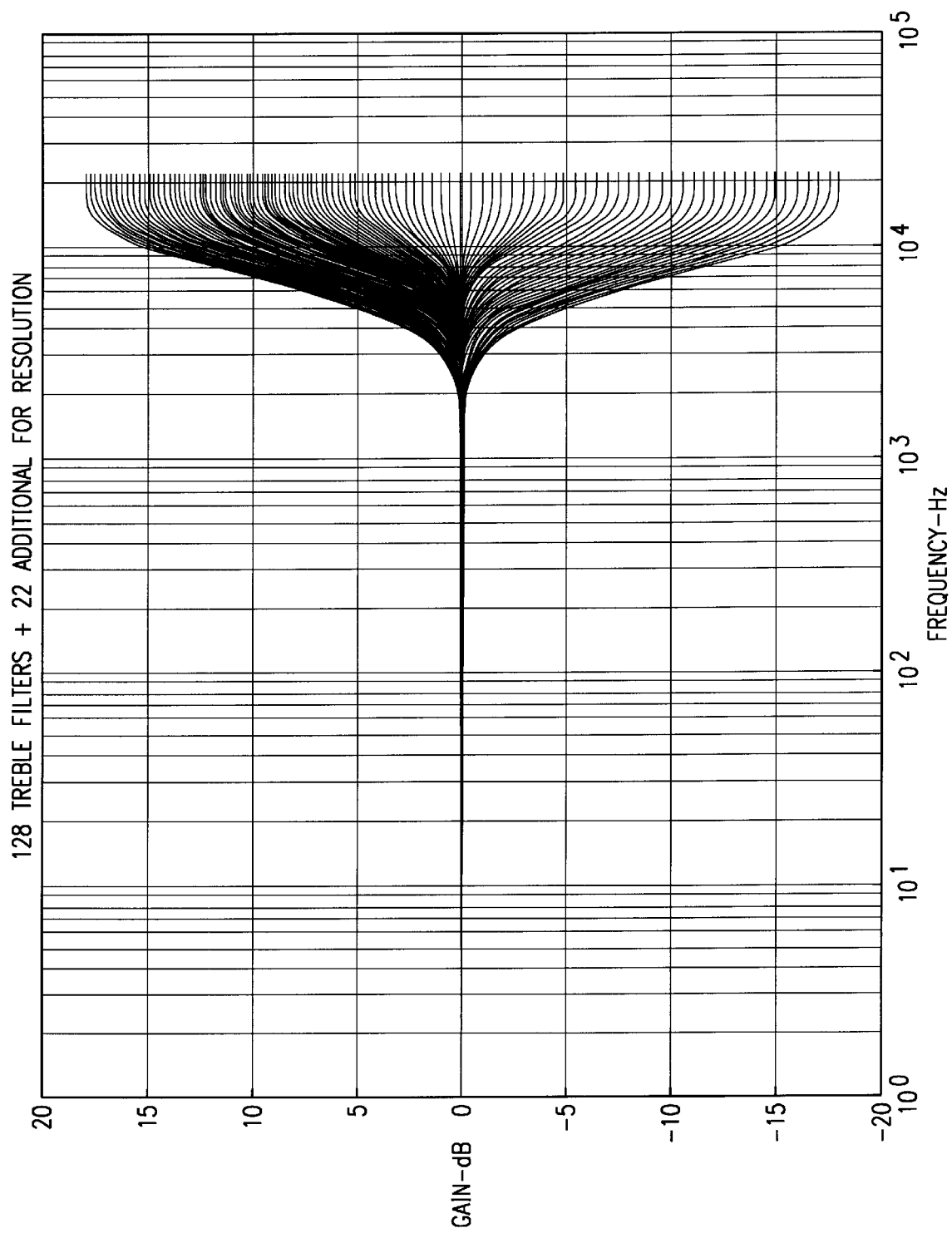
FIG. 10 is a graph of a "Final Digital Treble Filter Gain Versus Frequency" plot for 150 Shelving filter steps between +/−18 dB where the 128 filter steps are uniformly spaced on a linear scale and 22 additional filter steps are added for resolution to optimize listening pleasure and provide reasonable adjustability by the user.

Throughout the investigation treble and bass control ranges of ±18 dB with 100 Hz corner frequencies for bass and a 10 kHz corner for treble were assumed. These parameters are easily changed and do not affect the overall architecture. FIG. 9 shows the treble filter gain versus frequency for 128 Shelving filters with uniform linear spacing between +/−18 dB. However, in considering the series of filter plots in FIG. 9, it is clear that there are places where, if only these filters were used, the adjustability resolution is too low. For example, there is a 4 dB gap between −18 dB and the next filter. Generally the user will want resolution steps smaller than 1 dB. Adding additional filters for more resolution is no problem since what is shown in FIG. 9 is the minimum set of filters to prevent audible artifacts. For this reason the following approach was chosen: 1) maintain the 128 original filters, and 2) add twenty-two (22) additional filters between them to fill in the gaps and provide the necessary resolution. Such a set of filters is shown in FIG. 10. Additional listening tests verified that the filter set of FIG. 10 did indeed provide an artifact-free, pleasant listening experience while offering the desired adjustability resolution.

With this new invention filter updating or incrementing is accomplished simply. An input word indicates the new gain setting and the device simply steps through each of the filters between the current setting and the new tone control setting, filtering 64 samples between each step. In this invention, all of the necessary filters are pre-defined in the device, and all transitions are implemented in the same way. The second portion of this disclosure is to describe how filter coefficient changes can be efficiently and cost effectively implemented via a unique method.

Efficient and Cost Effective Digital Filter Implementation

The filter set in FIG. 10 contains 150 total filters. It is necessary that the device has definitions to all of them, and be able to move back and forth through each of them when the treble filter coefficient updates are made. However, storing all of these coefficients can be expensive. Therefore, a method that only requires storage of one set of filter coefficients and approximately six sets of updates or increments for those coefficients was developed. This process is described below.

An embodiment of the process includes the following:
1. Determine the set of Shelving filters to be used. (In the example treble case described, it is the set of 150 filters shown in FIG. 10);
2. Plot the filter coefficients as a function of filter step (FIGS. 11 & 12);
3. Piecewise linearize plots;
4. Select the initial set of filter coefficients to use (In this case the 0 dB coefficients are chosen as the default case);
5. Determine, based upon the piecewise linearization in step 3, the deltas or increments to be used when changing the filter coefficients;
6. Adjustment to the piecewise linearization may be required to minimize deviations from the desired filter response.

FIG. 11 shows the plots described in step 2 of the prior process. For the final treble configuration in FIG. 10, the plots are of the treble shelving filter coefficients for $b_0$, $b_1$, $b_2$, $a_1$ & $a_2$ plotted versus the filter steps from 1–150 for a +/−18 dB range. Coefficient $a_0$ is always defined as 1 and is not plotted.

By storing one set of coefficients and a small amount of update (increment) information, the filters necessary for implementing the entire suite in FIG. 10 can be computed simply. In the example shown, one set of coefficients and 5 or 6 sets of deltas are stored for the implementation. The computational burden is very light. This is a very low cost method of storing a large number of coefficients. Although this technique is general and can have various specific implementations, one example is shown.

When comparing this simplified and very efficient approach of incrementing for multiple filter changes to other possible methods of 1) storing the formulas and calculating the coefficients or 2) storing a complete set of coefficients, one can immediately see the significance. The implementation of calculating all the filter coefficients from a stored formula would require in the range of 40–200 times the number of machine (controller) cycles required to execute the incrementing approach discussed in this invention. The memory required in this particular tone control application using the new simple technique would require storage of approximately 30–35 (24 bit) words versus 640–750 words if the coefficients were stored, a 95% reduction. Memory is typically inexpensive in an integrated circuit implementation, but, it can be expensive to add additional blocks of memory when available memory capacity has been reached.

Simulation as well as hardware implementation in silicon of both treble and bass (to be discussed later) was accomplished and verified the excellent results. The simulation software package used was Matlab, Release 5.1, April 1997. This is a product of The Math Works, 24 Prime Parkway, Natick, Ma. 01760. Before hardware implementation, the treble and base control techniques were prototyped using the standard Matlab software package. In the simulation, 16 bit, 44.1 KHz digital audio signal selections, in the form of wave files (a binary format) were processed. The treble and bass levels were moved through some preset patterns and were also moved to various random values. Evaluation was performed by outputting wave files to a CD and listening to the music for any processing artifacts in either the treble or bass.

The treble filter shown in FIG. 10 (150 filter steps) was implemented as follows: The initial floating point filter coefficients for 0 dB (Filter Step 114) are shown:

$$B=[b_0, b_1, b_2]=[1.00000000000000, -0.17123848513638, 0.17676118948322]$$

$$A=[a_0, a_1, a_2]=[1.00000000000000, -0.17123848513638, 0.17676118948322]$$

Formula 2: Treble filter coefficients for 0 dB.

All data is Matlab notation where applicable. The coefficients are for a filter with the definition shown in equation 1.

Table 2 shows the increments (updates) used to determine the filter coefficients for the specified filter step of the plots in FIG. 11.

TABLE 2

Floating point coefficient increments (updates) versus Filter Step for digital treble tone control
Treble Shelving Filter Coefficient Increments

| Filter-steps/Equation | $a_0, b_0$ | $a_1, b_1$ | $a_2, b_2$ |
|---|---|---|---|
| 1:79/B | 0.02653228920529 | −0.04275831648700 | 0.01550691716392 |
| 1:79/A | 0 | −7.543783385381142 e-004 | 3.526822075566871 e-005 |
| 80:97/B | 0.02943649194725 | −0.05000527961919 | 0.01346749191064 |
| 80:97/A | 0 | −0.00719677714679 | 0.00009548138550 |
| 98:113/B | 0.02785981884054 | −0.02237505711761 | 0.00660525302211 |
| 98:113/A | 0 | 0.01240607471399 | −0.00031605996896 |
| 114:125/B | 0.02605065361594 | −0.01602361396586 | 0.00489245334215 |
| 114:125/A | 0 | 0.01650483548648 | −0.00158534249424 |
| 126:150/B | 0.01840801549960 | 0.00253343212643 | 0.00311561817545 |
| 126:150/A | 0 | 0.03380670632966 | −0.00974964052817 |

The column on the left represents the filter step range of interest. The values across the top of the table are the filter coefficient increments (updates) of the variables ($a_0$, $a_1$, $a_2$, $b_0$, $b_1$, $b_2$) as appropriate. Upon initialization, the 0 dB coefficients are loaded (Formula 2). When commanded to a different treble setting, each intermediate filter setting is traversed. This is done by adding (when moving to a lower filter step) or subtracting (when moving to a higher filter) the appropriate incremental values from the coefficients. The lowest filter step is 1 and the highest is 150. Coefficient $a_0$ is always 1 so the delta is zero and no operation needs to be performed. When moving through 0 dB the actual initial coefficient is used, rather than calculated. Care must be taken to check for different increments at the breakpoints (of filter step ranges). Notice that the region 126:150 has different increments than region 114:125. In incrementing the filter number, the increment used is that associated with the current filter. So, when the transition from 125 to 126 is made, the increment for the 114:125 filter steps are used. When moving from 126 to 127, however, the increments for the 126:150 filter steps are used. When the command is received to move to a next lower filter, the increment used is that associated with the next destination region. This means that in moving from 127 to 126, the increments for the filter steps 126:150 are added. And in moving from 126 to 125 the increments for the filter steps 114:125 are added.

For a sample rate of 44.1 kHz, approximately 64 samples should be filtered with each set of coefficients before moving on to the next set. This number should be changed somewhat when using significantly different sample rates, since it is important to keep a similar time constant or delay between filter setting charges. (Note; the filter coefficients themselves are also sample rate dependent so they must be redefined if a different sample rate is to be used).

Various audio selections have been processed using these new filters and implementation described in this invention. In these demonstrations the filters were indexed through the entire range, and also indexed through random ranges. They prove to provide a pleasant listening experience, without artifacts.

One potential concern with this type of approach is the possibility of numerical instability if the filters are adjusted many times without reinitialization. However, since there is no random element to the coefficient calculation—a known, fixed quantity is added or subtracted with each increment or update—the coefficient values stay well behaved. This point was also verified through simulation.

Bass Filters

It was observed that the digital audio bass tone control adjustment is much less susceptible to artifacts than the treble adjustment. While the treble digital tone control technique previously discussed, i.e. linear steps between filter positions, does an effective job on the bass control, it turns out that the bass coefficients are much more sensitive to minor errors in the filter coefficients. Hence, to piecewise linearize the coefficient plots with enough accuracy, using the treble invention of linear spacing described, it becomes more expensive for bass than for treble. Since the bass is an easier problem, it was decided to approach the problem a little differently in order to keep the implementation cost low. The approach uses many of the concepts described for treble control, but modified for the bass situation. In this case, 128 bass filters were uniformly distributed (the normal technique) in dB across the ±18 dB range. This provides adequate resolution, a pleasant listening experience (for the bass case only), and makes the coefficients somewhat less susceptible to error than if they are uniformly distributed in linear space as the treble coefficients described in this invention Notice that, in the best case, fewer than 128 filters would provide adequate resolution. However, the additional filters are necessary to prevent excessive gaps and give the listener the expected resolution, between filter steps after piecewise linearization.

In this case, the (floating point) 0 dB coefficients are at filter step 64. These are shown below:

$$B=[1.00000000000000 \ -1.97985204614398 \ 0.98005300183903]$$

$$A=[1.00000000000000 \ -1.97985204614398 \ 0.98005300183903]$$

Formula 3: Bass filter coefficients for 0 dB.

Even with the change in gain distribution for the bass coefficients, the increments are still slightly more difficult than for the treble case. For bass, 6 linear regions were used for piecewise linearization, as opposed to the 5 used for treble. The increments for the entire 128 filter steps are shown in Table 3. The coefficients and increments shown are floating point values. Fixed-point implementations are also possible as long as adequate precision is maintained. If the available precision is too low, the resulting filter responses might deviate for the original. To some extent, this problem can be minimized by adjusting the original filters such that the resulting filters will exhibit the proper responses.

TABLE 3

Floating point coefficient increments versus filter step for digital bass tone control
Bass Shelving Filter Coefficient Increments

| Filter Steps/ Equation | $a_0, b_0$ | $a_1, b_1$ | $a_2, b_2$ |
|---|---|---|---|
| 1:26 B | 3.946449554792508 e-004 | 4.830567905522720 e-005 | −4.062466274090682 e-004 |
| 1:26 A | 0 | 3.024571660614761 e-005 | −2.966163437889690 e-005 |
| 27:42 B | 2.857287077275838 e-004 | 1.495963324777971 e-004 | −4.145550005097976 e-004 |
| 27:42 A | 0 | 1.404639522857298 e-004 | −1.379586729745030 e-004 |
| 43:63 B | 1.668071537030968 e-004 | −1.487609149517510 e-004 | −1.407624674298891 e-005 |
| 43:63 A | 0 | −1.521377054942708 e-004 | 1.493541164174772 e-004 |
| 64:84 B | 1.659290781091949 e-004 | −1.754733270684650 e-004 | 1.237547055510380 e-005 |
| 64:84 A | 0 | −1.788264141853180 e-004 | 1.749514615472236 e-004 |
| 85:108 B | 3.001079188583722 e-004 | −7.057047575922404 e-004 | 4.036472607082952 e-004 |

TABLE 3-continued

Floating point coefficient increments versus filter step for digital bass tone control
Bass Shelving Filter Coefficient Increments

| Filter Steps/ Equation | | $a_0, b_0$ | $a_1, b_1$ | $a_2, b_2$ |
|---|---|---|---|---|
| 85:108 | A | 0 | −7.160843568969621 e-004 | 6.933755802618347 e-004 |
| 109:127 | B | 4.065635951875368 e-004 | −8.259826802887726 e-004 | 4.190901904891353 e-004 |
| 109:127 | A | 0 | −8.456883624656797 e-004 | 8.059481034996541 e-004 |

FIG. 12 shows the piecewise linearized plots of the bass shelving coefficients for $b_0$, $b_1$, $b_2$, $a_1$ & $a_2$ versus the filter steps from 1–127 for +/−18 dB range.

Figure 13:
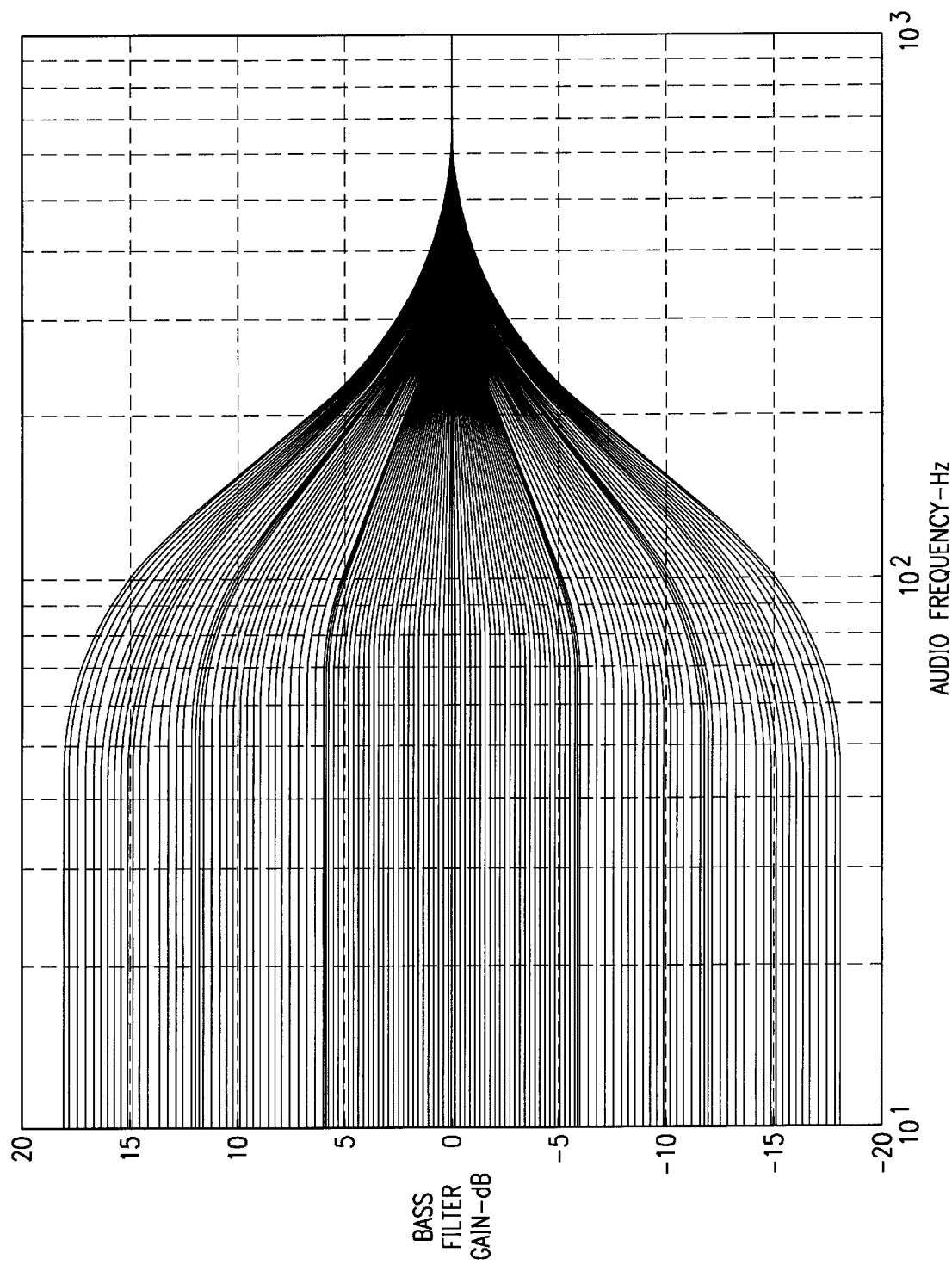
FIG. 13 is a graph of the "Final Digital Bass Filter Gain Versus Frequency" for the 128 digital Shelving filters where the filter steps are uniformly (equal) spaced on a linear dB scale for a +/−18 dB range.

The bass filter gain versus frequency for all the filter steps arising from the bass coefficients and increments described are shown in dB vs. frequency in FIG. 13.

The functional block diagram of the hardware implementation of this digital audio tone control (both treble and bass) concept is shown in FIG. 14. The system is composed of: a tone controller (117), which integrates all the inputs; a processor (118), which controls the entire system; memory (119), which stores the current and desired audio treble and bass levels as well as the code, bass and treble filter coefficients and the filter step increments. This is a general implementation, and as long as the function is available, the block diagram is applicable.

This invention describes a new and very unique way of designing a digital audio tone control system that will eliminate artifacts as the settings are changed. Also described is a very efficient method of implementing the complex digital Shelving filter coefficients used in both the treble and bass tone controls. This will be applicable where there are limitations, such as 1) memory storage space, 2) processor computational power, 3) integrated circuit die size available and/or 4) other cost considerations. Typically, this efficient method could be very important for small, cost sensitive, moderate-high performance stand-alone audio systems, while the method of eliminating artifacts is applicable to any digital tone control implementation. An efficient way of implementing the filter steps for digital tone control is described. Instead of storing all of the filter coefficients, or the equations for the calculation of filter coefficients and then calculating each coefficient step, this invention stores one set of filter coefficient values and a small amount of additional information and then increments the coefficients between all the other steps. This invention can reduce the memory required by as much as 95% or the machine cycles for implementing filter coefficients by 40–200 times. This new efficient method is accomplished by: 1) defining the filter coefficients, 2) piecewise linearizing the plot of filter coefficients versus filter step to define the linear regions, 3) defining the initial set of filter coefficients, and 4) defining increments between filter steps.

What is claimed is:

1. A digital tone controller, comprising:
a minimum set of shelf filters each passing the full extent of a given frequency band with a predetermined linear uniform spacing between the gain of successive filters.

2. The digital tone controller, as set forth in claim 1, wherein the gain of the shelf filters being linearly uniformly distributed in a first region above 0 dB and a second region below 0 dB.

3. The digital tone controller, as set forth in claim 2, further comprising an additional set of shelf filters with a predetermined uniform dB spacing in the second region.

4. The digital tone controller, as set forth in claim 3, wherein the additional set of shelf filters comprise shelf filters having a uniform gain spacing of 0.5 dB in the second region.

5. The digital tone controller, as set forth in claim 1, wherein the minimum set of shelf filters comprises at least 128 shelf filters with linearly spaced gains spanning between +/−18 dB.

6. The digital tone controller, as set forth in claim 4, wherein the minimum set of shelf filters and the additional set of shelf filters comprise at least 150 shelf filters.

7. The digital tone controller, as set forth in claim 4, wherein the minimum set of shelf filters and the additional set of shelf filters comprise at least 150 shelf filters and at least 64 samples between successive gain changes.

8. A method of digital tone control, comprising:
receiving a user-selected gain setting for a shelf filter;
gradually increasing or decreasing the shelf filter gain in uniform steps on a linear scale to approximate as closely as possible the user-selected gain setting.

9. The method, as set forth in claim 8, wherein gradually increasing or decreasing the filter gain comprises changing filter coefficients of the shelf filter to change the gain of the shelf filter in uniform steps on a linear scale toward the user-selected gain setting.

10. The method, as set forth in claim 8, wherein gradually increasing or decreasing the filter gain comprises:
changing filter coefficients of the shelf filter to change the gain of the shelf filter in uniform steps on a linear scale for gain above 0 dB; and
changing filter coefficients of the shelf filter to change the gain of the shelf filter in uniform steps on a logarithmic dB scale for gain below 0 dB.

11. The method, as set forth in claim 8, wherein gradually increasing or decreasing the filter gain comprises computing filter coefficients of the shelf filters using piecewise linearization approximation to compute the filter coefficients.

12. The method, as set forth in claim 8, wherein gradually increasing or decreasing the filter gain comprises:
storing a set of filter coefficient values for the filter and some coefficient update data;
determining a filter index of a filter to be computed; and
computing at least one second set of filter coefficients from the stored set of filter coefficient values, the filter index, and the coefficient update data by using piecewise linearization approximation.

13. The method, as set forth in claim 12, wherein storing a set of filter coefficient values comprises storing the filter coefficient values for 0 dB and a set of coefficient delta values for each linear coefficient region.

14. The method, as set forth in claim 12, wherein the computing step comprises:

determining the current filter index and the ending filter index corresponding to the user-selected gain setting; and changing the filter coefficient values by the stored coefficient delta values corresponding to the linear coefficient region for each intermediate filter coefficient values between the current filter index and the ending filter index until the user-selected gain setting is reached.

15. A method of digital tone control, comprising:

defining a minimum set of shelf filters each passing the full extent of a given frequency band having uniform linearly spaced gain above 0 dB, and an additional set of shelf filters having uniform logarithmic dB spaced gain below 0 dB;

storing a set of filter coefficient values for the shelf filters and coefficient delta data for each linear region of the filter coefficients;

determining a filter index of a filter to be computed; and computing at least one second set of filter coefficients from the stored set of filter coefficients from the stored set of filter coefficient values, the filter index, and the coefficient update data by using piecewise linearization approximation.

16. The method, as set forth in claim 15, wherein the computing step comprises:

determining the current filter index and the ending filter index corresponding to a user-selected gain setting; and changing the filter coefficient values by the stored coefficient delta values corresponding to the linear coefficient region for each intermediate filter coefficient values between the current filter index and the ending filter index until the user-selected gain setting is reached.

17. The method, as set forth in claim 15, further comprising:

changing filter coefficients of the shelf filter to change the gain of the shelf filter in uniform steps on a linear scale for gain above 0 dB; and changing filter coefficients of the shelf filter to change the gain of the shelf filter in uniform steps on a logarithmic dB scale for gain below 0 dB.

18. The method, as set forth in claim 15, wherein storing a set of filter coefficient values comprises storing the filter coefficient values for 0 dB and a set of coefficient delta values for each linear coefficient region.

* * * * *